(12) United States Patent
Hung et al.

(10) Patent No.: US 10,865,496 B2
(45) Date of Patent: Dec. 15, 2020

(54) PLATING APPARATUS AND PLATING METHOD

(71) Applicant: Taiwan Semiconductor Manufacturing Co., Ltd., Hsinchu (TW)

(72) Inventors: Tuan-Yu Hung, Changhua County (TW); Hung-Jui Kuo, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/361,169

(22) Filed: Mar. 21, 2019

(65) Prior Publication Data
US 2020/0131664 A1 Apr. 30, 2020

Related U.S. Application Data

(60) Provisional application No. 62/753,030, filed on Oct. 30, 2018.

(51) Int. Cl.
*C25D 17/02* (2006.01)
*C25D 5/08* (2006.01)
(Continued)

(52) U.S. Cl.
CPC ............ *C25D 17/02* (2013.01); *C25D 5/08* (2013.01); *C25D 17/06* (2013.01); *H01L 21/2885* (2013.01)

(58) Field of Classification Search
CPC . C25D 5/08; C25D 5/12; C25D 17/02; C25D 17/06; H01L 21/2885
See application file for complete search history.

(56) References Cited

U.S. PATENT DOCUMENTS

2004/0245094 A1* 12/2004 McHugh .............. C25D 17/001
                                                                                                 204/253
2009/0139871 A1* 6/2009 Saito ...................... C25D 21/12
                                                                                                 205/148

(Continued)

FOREIGN PATENT DOCUMENTS

| TW | I457471 | 10/2014 |
|---|---|---|
| TW | I498451 | 9/2015 |
| TW | 201702437 | 1/2017 |

OTHER PUBLICATIONS

"Office Action of Taiwan Counterpart Application", dated Mar. 30, 2020, p. 1-p. 3.

*Primary Examiner* — Ciel P Contreras
(74) *Attorney, Agent, or Firm* — JCIPRNET

(57) ABSTRACT

A plating apparatus includes a plating bath, a substrate holder, an anode electrode, and a fluid stirring member. The plating bath is configured to contain a plating solution. The substrate holder is configured to hold a substrate to be plated in the plating bath. The anode electrode is disposed in the plating bath. The fluid stirring member is disposed between the anode electrode and the substrate to be plated, and includes a plurality of first stirring stripes a plurality of second stirring stripes. The first stirring stripes extend along a first direction parallel to a plating surface of the substrate to be plated. The second stirring stripes extend along a second direction intersected with the plurality of first stirring stripes and parallel to the plating surface, wherein the fluid stirring member is configured to reciprocate along the first direction and the second direction.

20 Claims, 6 Drawing Sheets

(51) Int. Cl.
*C25D 17/06* (2006.01)
*H01L 21/28* (2006.01)
*H01L 21/288* (2006.01)

(56) References Cited

U.S. PATENT DOCUMENTS

2012/0199475 A1* 8/2012 McHugh .............. C25D 17/001
　　　　　　　　　　　　　　　　　　　　　　　204/273
2019/0112727 A1* 4/2019 Chang .................... C25D 21/10

* cited by examiner

PLATING APPARATUS AND PLATING METHOD

CROSS-REFERENCE TO RELATED APPLICATION

This application claims the priority benefit of U.S. provisional application Ser. No. 62/753,030, filed on Oct. 30, 2018. The entirety of the above-mentioned patent application is hereby incorporated by reference herein and made a part of this specification.

BACKGROUND

It is common practice to form protruding connection electrodes (bumps, pillars, etc.) of gold, copper, solder or nickel, or redistribution circuit layers of such metals at predetermined portions (electrodes) of a surface of a semiconductor package. There are various methods available for the formation of such electrical connectors, such as electroplating, vapor deposition, printing and ball bumping. Of these, electroplating, which can form fine lines and can be performed in a relatively stable manner, is most commonly used as terminals of semiconductor chip increases and the electrode pitch becomes smaller.

A plating apparatus is known to include a plating tank for holding therein a plating solution, a substrate holder for holding a substrate (plating object), an anode vertically held by an anode holder and facing the substrate in the plating tank, and a paddle disposed between the anode and the substrate for stirring the plating solution.

During the plating, the plating solution is stirred with the paddle disposed between the anode and the substrate so as to uniformly supply a sufficient amount of ions to the substrate, thereby forming a metal layer (film) having a more uniform thickness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
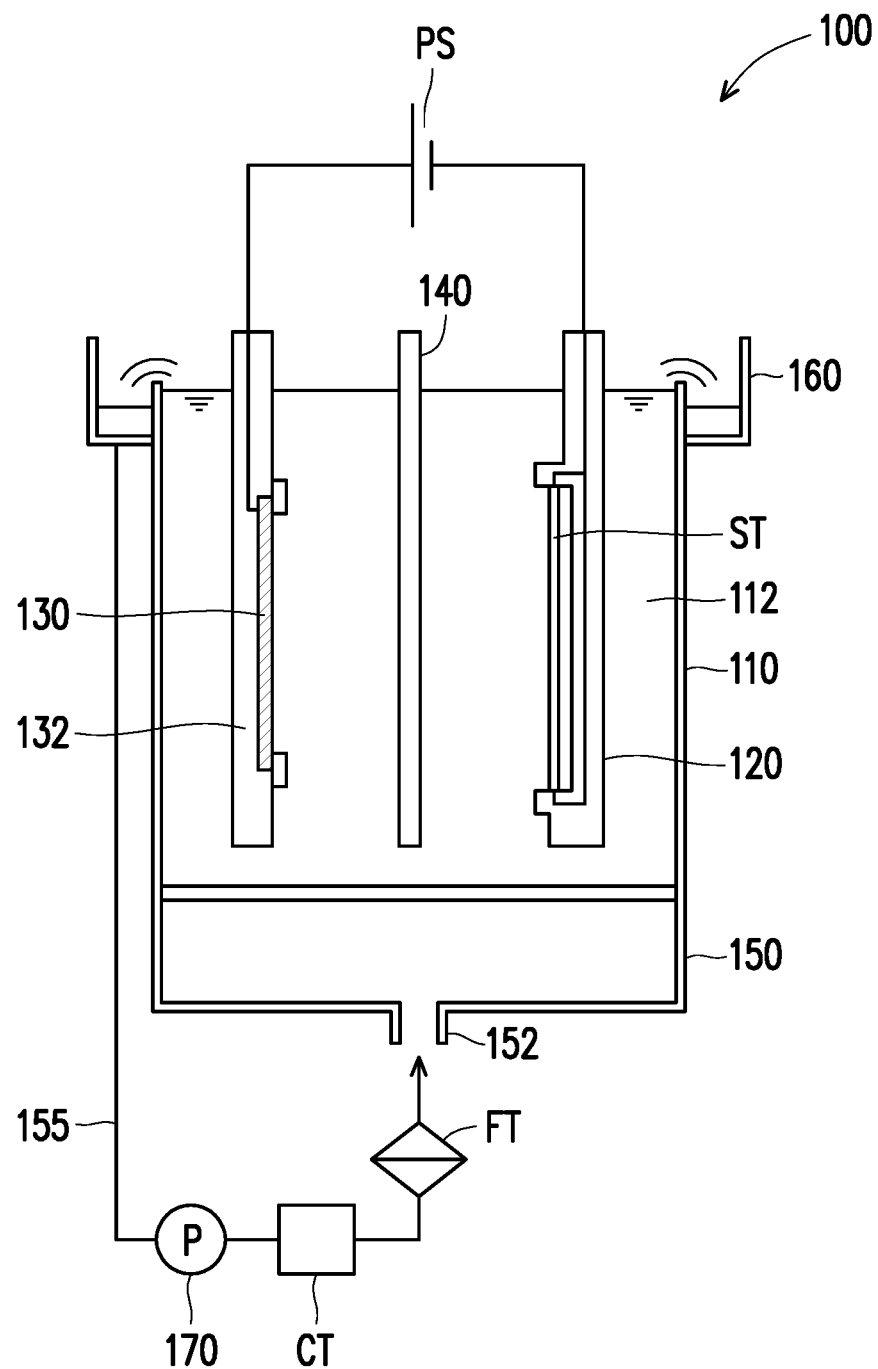
FIG. 1 illustrates a schematic view of a plating apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic view of a plating apparatus in accordance with some embodiments. With now reference to FIG. 1, in some embodiments, the plating apparatus 100 is configured to perform a plating process on a substrate ST to be plated. In some embodiments, the substrate ST may be a semiconductor wafer, but the disclosure is not limited thereto. In some embodiments, the plating apparatus 100 may include a plating bath 110, a substrate holder 120, an anode electrode 130, a fluid stirring member 140, a distribution chamber 150, and an overflow tank 160. The plating bath 110 is configured to contain a plating solution 112 therein. In some embodiments, the distribution chamber 150 may be connected to a plating solution source for supplying the plating solution 112 to the plating path 110. The overflow tank 160 may be disposed on a side (e.g. an upper end) of the plating bath 110 for receiving the plating solution 112 that has overflowed an edge of the plating bath 110.

In some embodiments, the supply pipe 155 may be connected between the overflow tank 160 and the distribution chamber 150. In some embodiments, one end of a supply pipe 155, which is provided with a pump 170, is connected to a bottom of the overflow tank 160, and another end of the supply pipe 155 is connected to a plating solution supply inlet 152 provided at a bottom of the distribution chamber 150. With such arrangement, the plating solution 112 in the overflow tank 160 may be returned into the distribution chamber 150 and the plating bath 110 by the actuation of the pump 170. Located downstream of the pump 170, a constant-temperature module CT for controlling the temperature of the plating solution 112 and a filter FT for filtering out foreign matter contained in the plating solution 112 are interposed in the supply pipe 155. It is noted that the configuration of the plating apparatus 100 described herein is merely for illustration, and the disclosure is not limited thereto.

In some embodiments, a separation plate is installed at the bottom of the plating bath 110. In order for the plating solution 112, supplied from the plating solution supply inlet 152 provided at the bottom of the distribution chamber 150, to form a uniform flow over the entire surface of a substrate to be plated ST, the separation plate may include a plurality of plating solution passage holes for the plating solution to pass therethrough.

In some embodiments, the plating apparatus 100 also includes a substrate holder 120 for detachably holding the substrate (plating object) ST and immersing the substrate ST in a vertical position in the plating solution 112 in the plating bath 110. The anode 130, held by an anode holder 132 and immersed in the plating solution 112 in the plating bath 110, is disposed opposite the substrate ST held by the substrate holder 120 and immersed in the plating solution 112. In some embodiments, phosphorus-containing copper may be used for the anode 130, but the disclosure is not limited thereto. The substrate ST and the anode 130 may be electrically connected via a plating power source PS, and a plated film (copper film) is formed on the surface of the substrate ST by passing electric current between the substrate ST and the anode 130.

In some embodiments, the fluid stirring member 140, which reciprocates parallel to a surface of the substrate ST to stir the plating solution 112, is disposed between the substrate ST, which is held by the substrate holder 120 and immersed in the plating solution 112, and the anode 130. In accordance with some embodiments of the disclosure, the plating solution 112 can be stirred by reciprocating the fluid stirring member 140, and by stirring the plating solution 112 with the fluid stirring member 140, a sufficient amount of copper ions can be supplied uniformly to the plating surface of the substrate ST.

Figure 2:
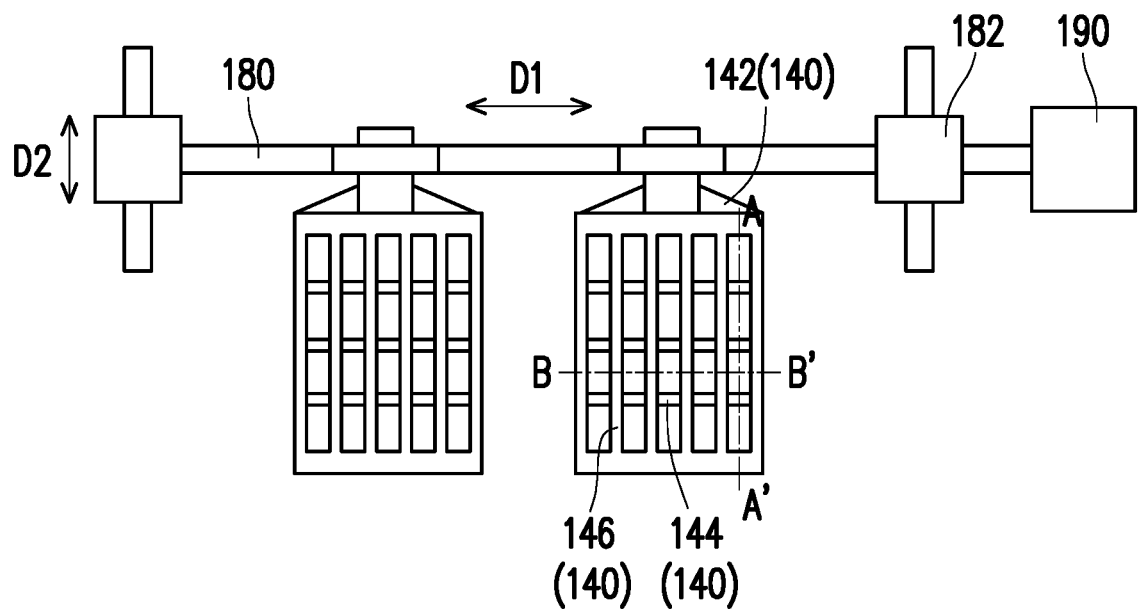
FIG. 2 illustrates a schematic view of a fluid stirring member in accordance with some embodiments.

FIG. 2 illustrates a schematic view of a fluid stirring member in accordance with some embodiments. With now reference to FIG. 1 and FIG. 2, in some embodiments, the fluid stirring member 140 may include a frame portion 142, a plurality of first stirring stripes 144 and a plurality of second stirring stripes 146. In the present embodiment, the fluid stirring member 140 may be a rectangular plate-like member having a uniform thickness. The first stirring stripes 144 and the second stirring stripes 146 are disposed on the frame portion 142 in a grid-like manner as it is shown in FIG. 2. In some embodiments, the first stirring stripes 144 (three first stirring stripes 144 are illustrated herein but not limited thereto) are parallel to one another and extend along a first direction D1 parallel to the plating surface of the substrate ST. The second stirring stripes 146 (four second stirring stripes 146 are illustrated herein but not limited thereto) are parallel to one another and extend along a second direction D2 intersected with the first stirring stripes 144 and parallel to the plating surface of the substrate ST. The fluid stirring member 140 is configured to reciprocate along the first direction D1 and the second direction D1. In the present embodiment, the first direction D1 (or the first stirring stripes 144) and the second direction D1 (or the second stirring stripes 146) are substantially perpendicular to each other, but the disclosure is not limited thereto.

In accordance with some embodiments of the disclosure, the first stirring stripes 144 may be horizontally-extending stripes, while the second stirring stripes 146 may be vertically-extending stripes, but the disclosure is not limited thereto. In some embodiments, the fluid stirring member 140 may be formed of, for example, titanium with a Teflon coating. The length of each first stirring stripe 144 and its reciprocation distance may be sufficiently larger than the lateral size of the substrate ST, and the length of each second stirring stripe 146 and its reciprocation distance may be sufficiently larger than the vertical size of the substrate ST.

In accordance with some embodiments of the disclosure, the plating apparatus 100 may further include a driving shaft 180 and a bi-directional driver 190. In some embodiments, the driving shaft 180 is disposed above the plating bath 110 for holding the fluid stirring member 140 to be immersed in the plating solution 112. The bi-directional driver 190 is coupled to the driving shaft 180 to drive the driving shaft 180 reciprocating along the first direction D1 and the second direction D2. The driving shaft 180 held by shaft holders 182 is capable of sliding along the first direction D1 and the second direction D2. In some embodiments, the end of the driving shaft 180 is coupled to the bi-directional driver 190 for reciprocating the fluid stirring member 140, for example, vertically and horizontally. In one of the implementations, the bi-directional driver 190 is configured to convert the rotation of a motor into the bi-directional linear reciprocating movement of the driving shaft 180 by, for example, a crank mechanism. In some embodiments, the bi-directional driver 190 may further include a controller (not shown), which controls the movement velocity of the fluid stirring member 140 by controlling the rotational speed of the motor of the bi-directional driver 190. Instead of the bi-directional driver 190, which uses the crank mechanism, it is also possible to use a bi-directional driver 190, which converts the rotation of a servo motor into the bi-directional linear reciprocating movement of the driving shaft 180 by a ball screw, or a bi-directional driver 190 which linearly reciprocates the driving shaft 180 by a linear motor. The disclosure is not limited thereto.

Figure 3:
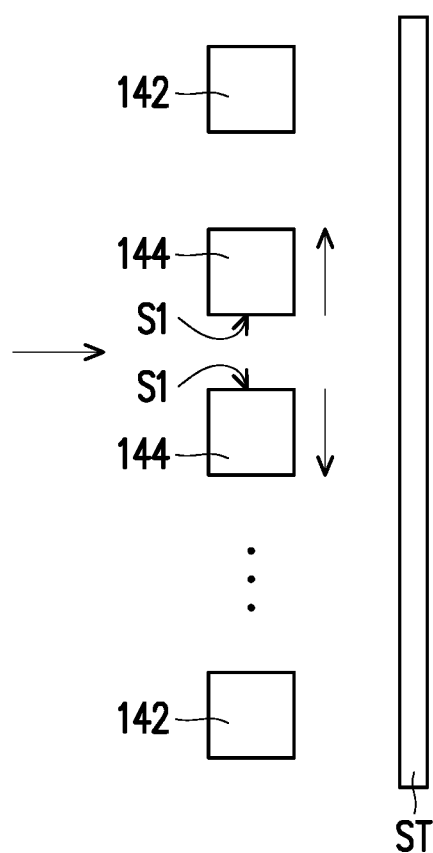
FIG. 3 illustrates a schematic cross sectional view along line A-A' of the fluid stirring member in FIG. 2 in accordance with some embodiments.
Figure 4:
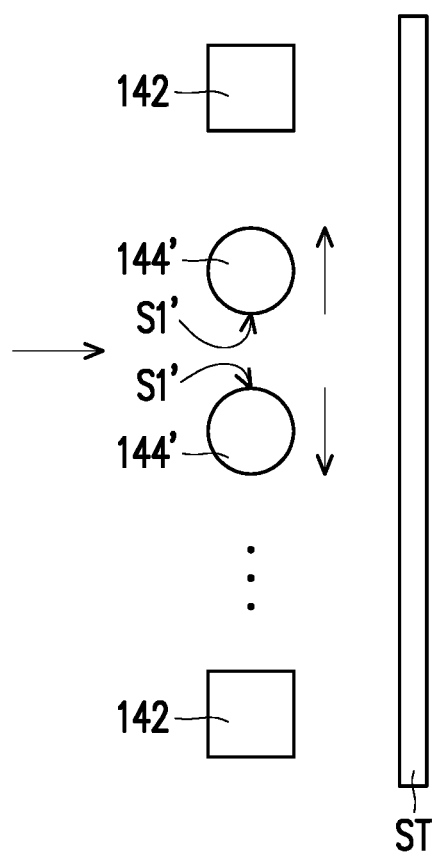
FIG. 4 illustrates a schematic cross sectional view along line A-A' of the fluid stirring member in FIG. 2 in accordance with other embodiments.

FIG. 3 illustrates a schematic cross sectional view along line A-A' of the fluid stirring member in FIG. 2 in accordance with some embodiments. FIG. 4 illustrates a schematic cross sectional view along line A-A' of the fluid stirring member in FIG. 2 in accordance with other embodiments. It is noted that, for the sake of simplicity and clarity, two of the first stirring stripes 144 are illustrated. The disclosure does not limit the number of the first stirring stripes 144. In some plating process such as the plating process for forming a redistribution circuit layer on the substrate ST, photoresist layer formed on the substrate St is easily broken or flushed away if the plating solution is stirred excessively (i.e. the flow rate of the plating solution 112 being too high) by the fluid stirring member 140. Accordingly, in such plating process, the flow rate of the plating solution 112 flowing toward the substrate ST needs to be suppressed to avoid bridging of the redistribution circuit layer and improve yield of such plating process. With now reference to FIG. 2 to FIG. 4, a cross section of each of the first stirring stripes 144 is in a rectangular shape as it is shown in FIG. 3, a circular shape as it is shown in FIG. 4, or any suitable shapes with smooth contact surfaces S1 for the plating solution 112 to flow over. Thereby, when the plating solution 112 flow through the first stirring stripes 144 as illustrated with the arrows in FIG. 3, the flow rate of the plating solution 112 can be suppressed (reduced).

In the embodiments shown in FIG. 3, the first stirring stripes 144 in rectangular shapes allow the plating solution 112 to flow through the first stirring stripes 114 more smoothly without being stirred too much since the contact surfaces S1 of the first stirring stripe 144 for the plating solution 112 to flow over is rather smooth (a flat surface). Therefore, when a plating process for forming, for example, a redistribution circuit layer on the substrate ST is performed, the fluid stirring member 140 may be moved along the second direction D2 (intersected with the first direction D1 along which the first stirring stripes 144 are extended). As such, the plating solution 112 flows through and is stirred by the first stirring stripes 144 with smooth contact surfaces S1, so that the flow rate of the plating solution 112 can be suppressed (reduced).

Similarly, in the embodiments shown in FIG. 4, the first stirring stripes 144' in circular shapes allow the plating solution 112 to flow through the first stirring stripes 144' more smoothly since the contact surfaces S1' of the first stirring stripe 144' for the plating solution 112 to flow over is rather smooth (a curvy surface). Therefore, when the plating solution 112 flows through and is stirred by the first stirring stripes 144' with the smooth contact surfaces S1, the flow rate of the plating solution 112 can be suppressed (reduced). It is noted that the shapes of the first stirring stripes are not limited by the disclosure. In other embodiments, the shapes of the first stirring stripes can be modified as long as the contact surface of the first stirring stripes for the plating solution 112 to flow over is rather smooth to suppress or reduce the flow rate of the plating solution 112.

In accordance with some embodiments of the disclosure, the moving velocity of the fluid stirring member 140 may also be reduced in order to suppress or reduce the flow rate of the plating solution 112. That is to say, when a plating process for forming, for example, the redistribution circuit layer on the substrate ST is performed, the fluid stirring member 140 may be moved along the second direction D2 with slower moving velocity, so that the flow rate of the plating solution 112 can be suppressed (reduced). In other words, the fluid stirring member 140 reciprocates along the first direction D1 in a first velocity while reciprocates along the second direction D2 in a second velocity, and the second velocity is substantially smaller than the first velocity, so as to reduce the flow rate of the plating solution 112 by slowing down the moving velocity of the fluid stirring member 140.

Figure 5:
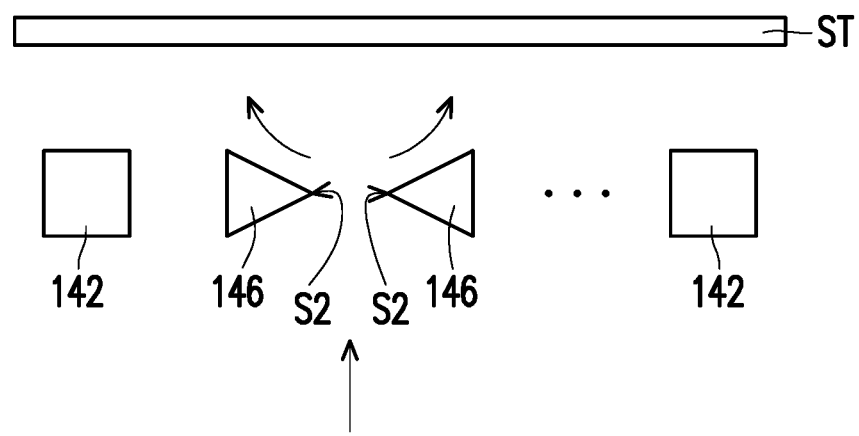
FIG. 5 illustrates a schematic cross sectional view along line B-B' of the fluid stirring member in FIG. 2.

FIG. 5 illustrates a schematic cross sectional view along line B-B' of the fluid stirring member in FIG. 2. In some plating process such as the plating process for forming a plurality of conductive pillars (e.g. TIV) on the substrate ST, topography or morphology of the conductive pillars formed on the substrate ST is unsatisfactory if the plating solution is stirred insufficiently by the fluid stirring member 140. In general, when the plating solution is stirred insufficiently (i.e. the flow rate of the plating solution 112 being too slow), it appears that the tips of the conductive pillars formed by such plating process are often in a tilted-dome shape due to insufficient or uneven amount of copper ions being supplied to the plating surface of the substrate ST. Such conductive pillars with tilted-dome shape would result in poor topography or morphology of the conductive pillars and cause misalignment of other components to be bonded onto the substrate ST.

Accordingly, in such plating process, the flow rate of the plating solution 112 flowing toward the substrate ST needs to be enhanced to improve avoidance of bridging of the redistribution circuit layer and improve topography or morphology of the conductive pillars formed by such plating process. Accordingly, a cross sectional shape of each of the second stirring stripes 146 may be different from a cross sectional shape of each of the first stirring stripes 144/144'. For example, with now reference to FIG. 2 and FIG. 5, a cross section of each of the second stirring stripes 146 is in a triangular shape or any suitable shapes with rough contact surfaces S2 for the plating solution 112 to flow over. In some embodiments, the cross sectional shape of each of the second stirring stripes 146 may be an isosceles triangle to achieve favorable stirring effect of the second stirring stripes 146, but the disclosure is not limited thereto. Thereby, when the plating solution 112 flows through the second stirring stripes 146 as illustrated with the arrows in FIG. 5, the flow rate or flow uniformity of the plating solution 112 can be enhanced or increased without actually increasing the moving velocity of the fluid stirring member 140. Accordingly, the risk of breaking the fluid stirring member 140 and the driver 190 due to high-speed operation is significantly reduced and the lifespan of the fluid stirring member 140 and the driver 190 can be improved.

Figure 6:
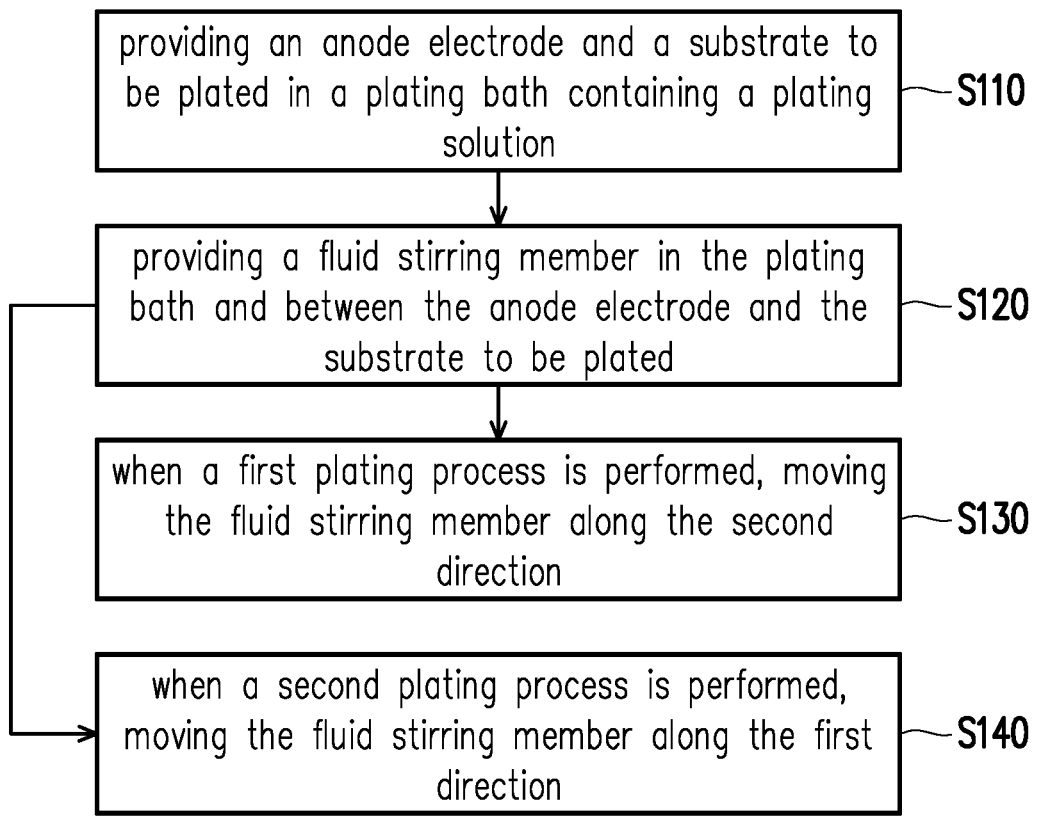
FIG. 6 illustrates a block diagram of a plating method in accordance with some embodiments.

FIG. 6 illustrates a block diagram of a plating method in accordance with some embodiments. With now reference to FIG. 2 and FIG. 6, with the application of the plating apparatus 100 described above, a plating method using the plating apparatus 100 is developed, and the plating method may include the following steps. First, in step S110, the anode electrode 130 and the substrate (plating object) ST are provided in the plating bath 110, which contains the plating solution 112. In some embodiments, the substrate ST may be a semiconductor wafer, and the plating process is for forming conductive structures such as redistribution circuit layers, or conductive pillars (through vias), etc., on the semiconductor wafer. The disclosure is not limited thereto. In some embodiments, the plating apparatus 100 may include a substrate holder 120 for detachably holding the substrate ST and immersing the substrate ST in a vertical position in the plating solution 112 in the plating bath 110. The anode 130, held by an anode holder 132 and immersed in the plating solution 112 in the plating bath 110, is disposed opposite the substrate ST held by the substrate holder 120 and immersed in the plating solution 112.

Then, in step S120, the fluid stirring member 140 is provided in the plating bath 110 and is disposed between the anode electrode 130 and the substrate ST. In some embodiments, the fluid stirring member 140 includes a plurality of first stirring stripes 144 extending along the first direction D1 and a plurality of second stirring stripes 146 extending along the second direction D2. The second stirring stripes 146 is intersected with the first stirring stripes 144. For example, the first stirring stripes 144 may be horizontally-extending stripes, while the second stirring stripes 146 may be vertically-extending stripes, but the disclosure is not limited thereto. In accordance with some embodiments of the disclosure, the first stirring stripes 144 and the second stirring stripes 146 are arranged in a grid-like manner as it is shown in FIG. 2. The fluid stirring member 140 is configured to reciprocate along the first direction D1 and the second direction D2.

With such configuration, when a first plating process (e.g. a plating process for forming a redistribution circuit layer on the substrate ST) is performed, the fluid stirring member 140 is moved along the second direction D2 so the plating solution 112 flows through and is stirred by the first stirring stripes 144 with smooth contact surfaces (performing step S130). In some embodiments, a cross section of each of the first stirring stripes 144 may be in a rectangular shape as it is shown in FIG. 3, a circular shape as it is shown in FIG. 4, or any suitable shapes with smooth contact surfaces S1/S1' for the plating solution 112 to flow over. Thereby, when the plating solution 112 flow through the first stirring stripes 144, the flow rate of the plating solution 112 can be suppressed (reduced), such that the risk of photoresist layer on the substrate ST being broken or flushed away by the plating solution 112 is reduced.

In accordance with some embodiments of the disclosure, when the first plating process is performed, the moving velocity of the fluid stirring member 140 may also be reduced in order to suppress or reduce the flow rate of the plating solution 112. That is to say, when a plating process for forming, for example, the redistribution circuit layer on the substrate ST is performed, the fluid stirring member 140 may be moved along the second direction D2 with slower moving velocity, so that the flow rate of the plating solution 112 can be suppressed (reduced). In other words, the fluid stirring member 140 is moved along the first direction D1 (stirring the plating solution with the second stirring stripes 146) in a first velocity, and the fluid stirring member 140 is moved along the second direction D2 (stirring with the first stirring stripes 144) in a second velocity substantially smaller than the first velocity. Thereby, the flow rate of the plating solution 112 is further reduced by slowing down the moving velocity of the fluid stirring member 140 during the first plating process.

When a second plating process (e.g. a plating process for forming conductive pillars on the substrate ST) is performed, the fluid stirring member 140 is moved along the first direction D1 so the plating solution 112 flows through and is stirred by the second stirring stripes 146 with rough contact surfaces (performing step S140). In some embodiments, a cross section of each of the second stirring stripes 146 may be in a rectangular shape as it is shown in FIG. 5, or any suitable shapes with rough contact surfaces S2 for the plating solution 112 to flow over. Thereby, when the plating solution 112 flow through the second stirring stripes 146, the flow rate of the plating solution 112 can be enhanced (increased), such that the plating solution 112 is stirred more sufficiently by the fluid stirring member 140 and topography or morphology of the conductive pillars can be improved. Thereby, when the plating solution 112 flow through the second stirring stripes 146, the flow rate of the plating solution 112 can be enhanced or increased without actually increasing the moving velocity of the fluid stirring member 140. Accordingly, the risk of breaking the fluid stirring member 140 due to high-speed operation is significantly reduced and the lifespan of the plating apparatus 100 can be improved.

In accordance with some embodiments of the disclosure, the cross sectional shapes of the first stirring stripes 144 may be the same as those of the second stirring stripes 146 with rough contact surfaces S2 as it is shown in FIG. 5. In some embodiments, the fluid stirring member 140 may merely include a set of stirring stripes extending along one direction, and the cross sectional shape of each of the stirring stripes may be in a triangular shape or any other suitable shapes with rough contact surfaces. With such arrangement, when the second plating process (e.g. plating process for forming conductive pillars on the substrate ST) is performed, the fluid stirring member 140 reciprocates in a normal velocity, and the flow rate of the plating solution is enhanced by the stirring stripes with rough contact surfaces. When the first plating process (e.g. plating process for forming redistribution circuit layers on the substrate ST) is performed, the fluid stirring member 140 reciprocates in a slower velocity (substantially slower than the normal velocity) to suppress the flow rate of the plating solution 112.

Figure 7:
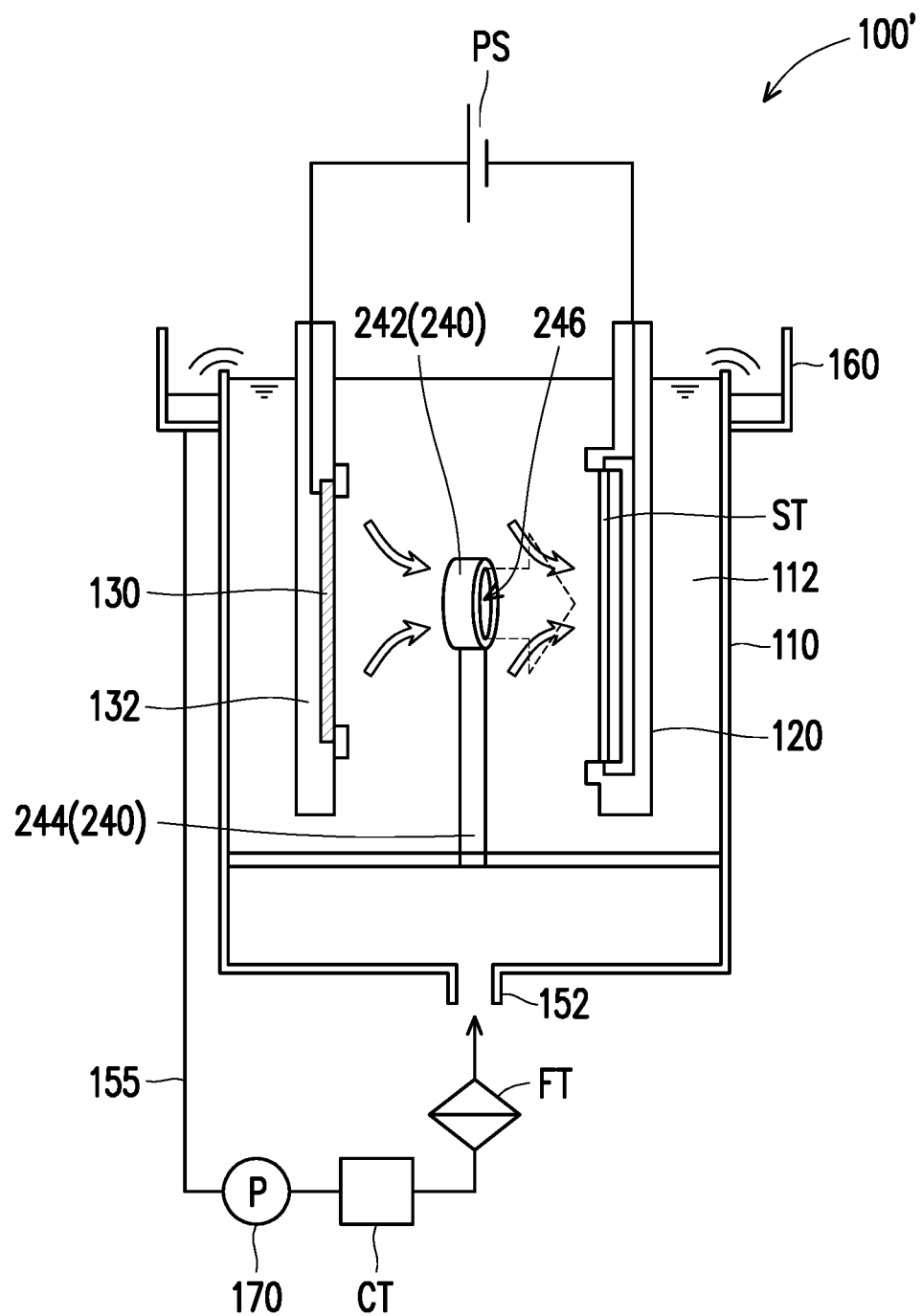
FIG. 7 illustrates a schematic view of a plating apparatus in accordance with some embodiments.
Figure 8:
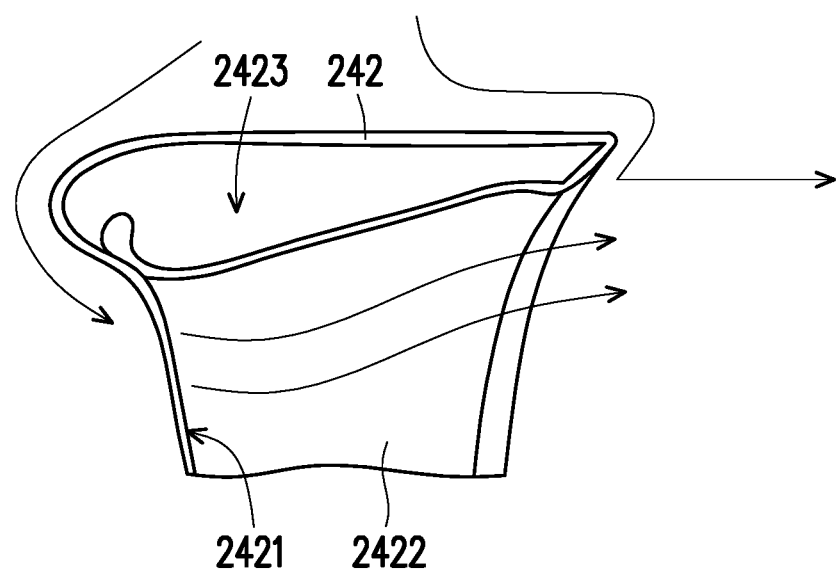
FIG. 8 illustrates a schematic cross sectional view of a fluid stirring nozzle in accordance with some embodiments.
Figure 9:
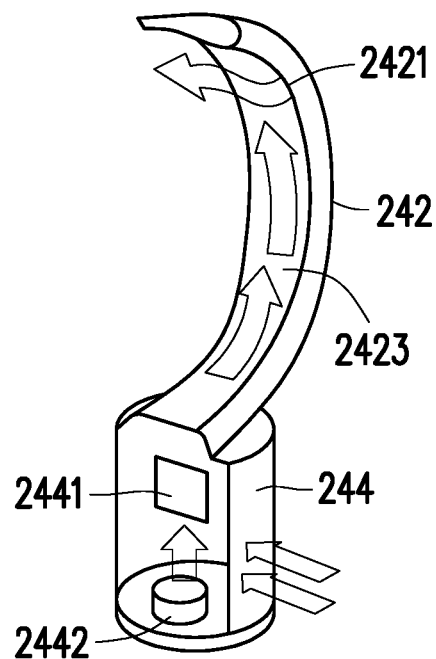
FIG. 9 illustrates a schematic cross sectional view of an annular member in accordance with some embodiments.

FIG. 7 illustrates a schematic view of a plating apparatus in accordance with some embodiments. FIG. 8 illustrates a schematic cross sectional view of a fluid stirring nozzle in accordance with some embodiments. FIG. 9 illustrates a schematic cross sectional view of an annular member in accordance with some embodiments. It is noted that the plating apparatus 100' shown in FIG. 7 to FIG. 9 contains many features same as or similar to the plating apparatus 100 disclosed earlier with FIG. 1. For purpose of clarity and simplicity, detail description of same or similar features may be omitted, and the same or similar reference numbers denote the same or like components. The main differences between plating apparatus 100' shown in FIG. 7 to FIG. 9 and the plating apparatus 100 disclosed earlier with FIG. 1 are described as follows.

With now reference to FIG. 7 to FIG. 9, in some embodiments, the plating apparatus 100' is configured to perform a plating process on the substrate ST. In some embodiments, the plating apparatus 100 may include a plating bath 110, a substrate holder 120, an anode electrode 130, and a fluid stirring nozzle 240. In some embodiments, the plating apparatus 100' may further include a distribution chamber 150 and an overflow tank 160. In some embodiments, the distribution chamber 150 may be connected to a plating solution source for supplying the plating solution 112 to the plating path 110. The overflow tank 160 may be disposed on a side (e.g. an upper end) of the plating bath 110 for receiving the plating solution 112 that has overflowed an edge of the plating bath 110. In some embodiments, the fluid stirring nozzle 240 is disposed between the anode electrode 130 and the substrate ST for supplying the plating solution 112 to the plating bath 110. For example, the fluid stirring nozzle 240 may be in fluid communication with the distribution chamber 150, and the plating solution 112 is provided to the plating bath 110 through the fluid stirring nozzle 240.

In accordance with some embodiments of the disclosure, the fluid stirring nozzle 240 includes an annular member 242 and a base 244. In accordance with some embodiments of the disclosure, the annular member 242 includes fluid outlet 2421 and an annular fluid passage 2423, and the base 244 includes a fluid inlet 2442 through which the plating solution 112 is provided into the annular fluid passage 2423. In some embodiments, the base 244 may be coupled to (in fluid communication with) the distribution chamber 150, so the plating solution 112 from the distribution chamber 150 can be provided to the plating bath 110 through the fluid inlet 2442. In some embodiment, the fluid inlet 2442 may include an array of apertures formed in the base 244. Alternatively, the fluid inlet 2442 may include one or more grilles or meshes mounted within windows formed in the base 244.

In accordance with some embodiments of the disclosure, the plating solution 112 is provided into the annular fluid passage 2423 through the annular fluid passage 2423, such that the plating solution 112 flows within the annular fluid passage 2423. In some embodiments, the fluid stirring nozzle 240 may further include a motor 2441 housed within the base 244. The motor 2441 is configured for rotating an impeller to generate a flow to pump the plating solution 112 into the annular fluid passage 2423. In some embodiments, an inner wall of the annular member 242 at least partially defines a bore 246 through which the plating solution 112 from outside the fluid stirring nozzle 240 is drawn by the plating solution 112 emitted from the fluid outlet 2421. In some embodiments, the fluid outlet 2421 is disposed on the annular member 242. For example, the fluid outlet 2421 is disposed on an inner wall of the annular member 242.

In accordance with some embodiments of the disclosure, the annular member 242 includes a drawing side (e.g. the left side of the annular member 242 shown in FIG. 7) and a discharging side (e.g. the right side of the annular member 242 shown in FIG. 7). The plating solution 112 from outside the fluid stirring nozzle 240 is drawn into the drawing side of the annular member 242. The plating solution 112 from the fluid outlet 2421 and the plating solution 112 drawn from outside the fluid stirring nozzle 240 are discharged from the discharging side of the annular member 242. In some embodiments, the fluid outlet 2421 is disposed at the drawing side, and the discharging side faces the substrate ST.

In some embodiments, the inner wall includes a guiding surface 2422, which tapers outwardly relative to an axis of the bore 246, such that the plating solution 112 is emitted from the bore 246 due to Bernoulli's principle. In some embodiments, the axis of the bore 246 may be perpendicular to the plating surface of the substrate ST. The emission of the plating solution 112 from the fluid outlet 2421 causes a secondary flow to be generated by the entrainment of the plating solution 112 from the external environment. Accordingly, the plating solution 112 from external environment is drawn to the annular member 242 through the bore 246, and from the environment both around and in front of the annular member 242. This secondary flow combines with the flow emitted from the fluid outlet 2421 to produce a combined, or total, flow, or current, projected forward from the bore 246. With such configuration, the plating solution 112 can be stirred and driven to flow toward the substrate ST without having any moving components such as the fluid stirring member 140 illustrated in FIG. 2. Without the moving components to stir the plating solution 112, it is less likely for the fluid stirring nozzle 240 to be broken, so the life span of the plating apparatus 100' can be increased.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a plating apparatus includes a plating bath, a substrate holder, an anode electrode, and a fluid stirring member. The plating bath is configured to contain a plating solution. The substrate holder is configured to hold a substrate to be plated in the plating bath. The anode electrode is disposed in the plating bath. The fluid stirring member is disposed between the anode electrode and the substrate to be plated, and includes a plurality of first stirring stripes a plurality of second stirring stripes. The first stirring stripes extend along a first direction parallel to a plating surface of the substrate to be plated. The second stirring stripes extend along a second direction intersected with the plurality of first stirring stripes and parallel to the plating surface, wherein the fluid stirring member is configured to reciprocate along the first direction and the second direction.

In accordance with some embodiments of the disclosure, a plating apparatus includes a plating bath, a substrate holder, an anode electrode, and a fluid stirring nozzle. The plating bath is configured to contain a plating solution. The substrate holder is disposed above the plating bath and configured to hold a substrate to be plated in the plating bath. The anode electrode is disposed in the plating bath. The fluid stirring nozzle is disposed between the anode electrode and the substrate to be plated for supplying the plating solution to the plating bath, and includes an annular member and a base. The annular member includes an annular fluid passage for the plating solution to flow therein and a fluid outlet disposed on the annular member. The base includes a fluid inlet through which the plating solution is provided into the annular fluid passage.

In accordance with some embodiments of the disclosure, a plating method includes the following steps. An anode electrode and a substrate to be plated are provided in a plating bath containing a plating solution. A fluid stirring member is provided in the plating bath and between the anode electrode and the substrate to be plated, wherein the fluid stirring member includes a plurality of first stirring stripes extending along a first direction and a plurality of second stirring stripes extending along a second direction and intersected with the plurality of first stirring stripes. When a first plating process is performed, the fluid stirring member is moved along the second direction, so the plating solution flows through and is stirred by the first stirring stripes with smooth contact surfaces. When a second plating process is performed, the fluid stirring member is moved along the first direction so the plating solution flows through and is stirred by the second stirring stripes with rough contact surfaces.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A plating apparatus, comprising:
   a plating bath configured to contain a plating solution;
   a substrate holder configured to hold a substrate to be plated in the plating bath;
   an anode holder configured to hold an anode electrode in the plating bath; and
   a fluid stirring member disposed between the anode electrode and the substrate to be plated, and comprising:
      a plurality of first stirring stripes extending along a first direction parallel to a plating surface of the substrate to be plated; and
      a plurality of second stirring stripes extending along a second direction intersected with the plurality of first stirring stripes and parallel to the plating surface, wherein the fluid stirring member is configured to reciprocate along the first direction and the second direction.

2. The plating apparatus as claimed in claim 1, wherein the fluid stirring member further comprises a frame portion, the first stirring stripes and the second stirring stripes are disposed on the frame portion in a grid-like manner.

3. The plating apparatus as claimed in claim 1, further comprising:
   a driving shaft disposed above the plating bath for holding the fluid stirring member to be immersed in the plating solution; and
   a bi-directional driver coupled to the driving shaft to drive the driving shaft reciprocating along the first direction and the second direction.

4. The plating apparatus as claimed in claim 3, wherein the bi-directional driver comprises a crank mechanism, a ball screw, or a linear motor.

5. The plating apparatus as claimed in claim 3, wherein the bi-directional driver drives the fluid stirring member to move along the second direction when a first plating process is performed, so the plating solution is stirred by the first stirring stripes.

6. The plating apparatus as claimed in claim 5, wherein the bi-directional driver drives the fluid stirring member to move along the first direction when a second plating process different from the first plating process is performed, so the plating solution is stirred by the second stirring stripes.

7. The plating apparatus as claimed in claim 6, wherein the first plating process comprises forming a redistribution circuit layer on the substrate to be plated, and the second plating process comprises forming a plurality of conductive pillars on the substrate to be plated.

8. The plating apparatus as claimed in claim 1, wherein the fluid stirring member reciprocates along the first direction in a first velocity and reciprocates along the second direction in a second velocity substantially smaller than the first velocity.

9. The plating apparatus as claimed in claim 1, wherein a cross sectional shape of each of the first stirring stripes is different from a cross sectional shape of each of the second stirring stripes.

10. The plating apparatus as claimed in claim 1, wherein a cross section of each of the first stirring stripes is in a rectangular shape.

11. The plating apparatus as claimed in claim 1, wherein a cross section of each of the second stirring stripes is in a triangular shape.

12. The plating apparatus as claimed in claim 1, wherein a cross section of each of the first stirring stripes is in a circular share.

13. The plating apparatus as claimed in claim 1, wherein a first contact surface of each of the plurality of first stirring stripes is smoother than a second contact surface of each of the plurality of second stirring stripes.

14. The plating apparatus as claimed in claim 1, further comprising a pump configured to actuate the plating solution to flow into the plating bath through a supply pipe.

15. The plating apparatus as claimed in claim 14, further comprising a constant-temperature module disposed at a downstream of the pump for controlling the temperature of the plating solution.

16. The plating apparatus as claimed in claim 14, further comprising a filter interposed in the supply pipe for filtering out foreign matter contained in the plating solution.

17. A plating method, comprising:
providing an anode electrode and a substrate to be plated in a plating bath containing a plating solution;
providing a fluid stirring member in the plating bath and between the anode electrode and the substrate to be plated, wherein the fluid stirring member comprises a plurality of first stirring stripes extending along a first direction parallel to a plating surface of the substrate to be plated and a plurality of second stirring stripes extending along a second direction and intersected with the plurality of first stirring stripes and parallel to the plating surface;
when a first plating process is performed, moving the fluid stirring member to reciprocate along the second direction so the plating solution flows through and is stirred by the first stirring stripes with smooth contact surfaces; and
when a second plating process is performed, moving the fluid stirring member to reciprocate along the first direction so the plating solution flows through and is stirred by the second stirring stripes with rough contact surfaces.

18. The plating method as claimed in claim 17, wherein the first plating process comprises forming a redistribution circuit layer on the substrate to be plated.

19. The plating method as claimed in claim 17, wherein the second plating process comprises forming a plurality of conductive pillars on the substrate to be plated.

20. The plating method as claimed in claim 17, wherein when the first plating process is performed, moving the fluid stirring member in a first velocity, when the second plating process is performed, moving the fluid stirring member in a second velocity substantially smaller than the first velocity.

* * * * *